United States Patent
Kawase

(10) Patent No.: US 6,472,817 B1
(45) Date of Patent: Oct. 29, 2002

(54) ORGANIC LIGHT EMITTING DEVICE INCORPORATING A WAVEGUIDE

(75) Inventor: Takeo Kawase, Cambridge (GB)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/743,990

(22) PCT Filed: May 16, 2000

(86) PCT No.: PCT/GB00/01872

§ 371 (c)(1),
(2), (4) Date: Feb. 5, 2001

(87) PCT Pub. No.: WO00/70690

PCT Pub. Date: Nov. 23, 2000

(51) Int. Cl.[7] ............................................. H05B 33/22
(52) U.S. Cl. .................. 313/504; 313/506; 313/503; 313/509
(58) Field of Search .................. 313/504, 509, 313/506, 503, 512, 498, 499

(56) References Cited

U.S. PATENT DOCUMENTS

| 5,546,413 A | 8/1996 | Lebby et al. | |
| 5,703,436 A | * 12/1997 | Forrest et al. | 313/506 |
| 5,994,835 A | * 11/1999 | Wilson et al. | 313/504 |
| 6,160,828 A | * 12/2000 | Kozlov et al. | 372/39 |

FOREIGN PATENT DOCUMENTS

| EP | 0 304 939 A3 | 3/1989 |
| EP | 0 304 939 A2 | 3/1989 |
| EP | 0 734 078 A2 | 9/1996 |
| EP | 0 878 883 A1 | 11/1998 |
| JP | 61-044483 | 3/1986 |
| JP | 8-315984 | 11/1996 |

* cited by examiner

Primary Examiner—Vip Patel
Assistant Examiner—Joseph Williams
(74) Attorney, Agent, or Firm—Oliff & Berridge, PLC

(57) ABSTRACT

The present invention provides an organic light emitting device having a first electrode and a transparent electrode with an organic light emitting layer therebetween; characterized by a waveguide provided on the opposite side of the transparent electrode compared to the organic light emitting layer. The present invention also provides a device incorporating at least two such organic light emitting devices so as to provide a pulsed modulation output or a multi-color output.

15 Claims, 9 Drawing Sheets

Light

Polyfluorene

PFMO

TFB $$\frac{4\pi(n_1 d_1 \cos\theta_1 + n_2 d_2 \cos\theta_2)}{\lambda} - 2\phi_s = 2m\pi \quad m = 0,1,2 \ldots$$

$$\tan\phi_s = \frac{(n_1^2 \sin^2\theta_1 - n_3^2)^{1/2}}{n_1 \cos\theta_1} \quad \text{(for TE Mode)}$$

$$\tan\phi_s = \frac{n_1(n_1^2 \sin^2\theta_1 - n_3^2)^{1/2}}{n_3^2 \cos\theta_1} \quad \text{(for TM Mode)}$$

$$n_1 \sin\theta_1 = n_2 \sin\theta_2 = n_w \sin(90-\delta)$$
$$\cong n_w$$

A-A' cross-section $$\frac{4\pi(n_1 d_1 \cos\theta_1 + n_2 d_2 \cos\theta_2)}{\lambda} - 2\phi_s = 2m\pi \quad m = 0,1,2\ldots$$

$$\tan\phi_s = \frac{(n_1^2 \sin^2\theta_1 - n_3^2)^{1/2}}{n_1 \cos\theta_1} \text{ (for TE Mode)}$$

$$\tan\phi_s = \frac{n_1(n_1^2 \sin^2\theta_1 - n_3^2)^{1/2}}{n_3^2 \cos\theta_1} \text{ (for TM Mode)}$$

$$n_1 \sin\theta_1 = n_2 \sin\theta_2 = n_w \sin(90-\delta)$$

$$\cong n_w$$

Fig.13 (cont. A)
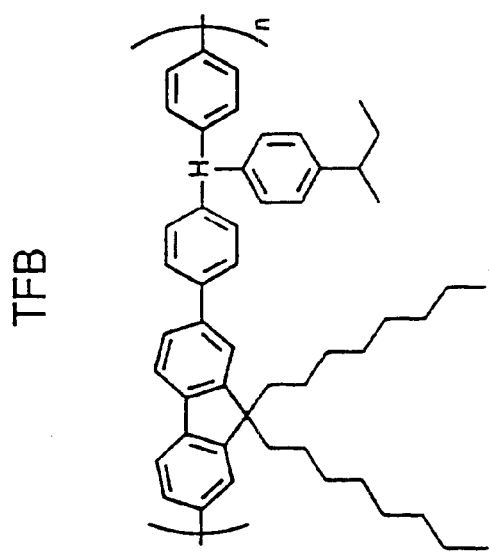
TFB
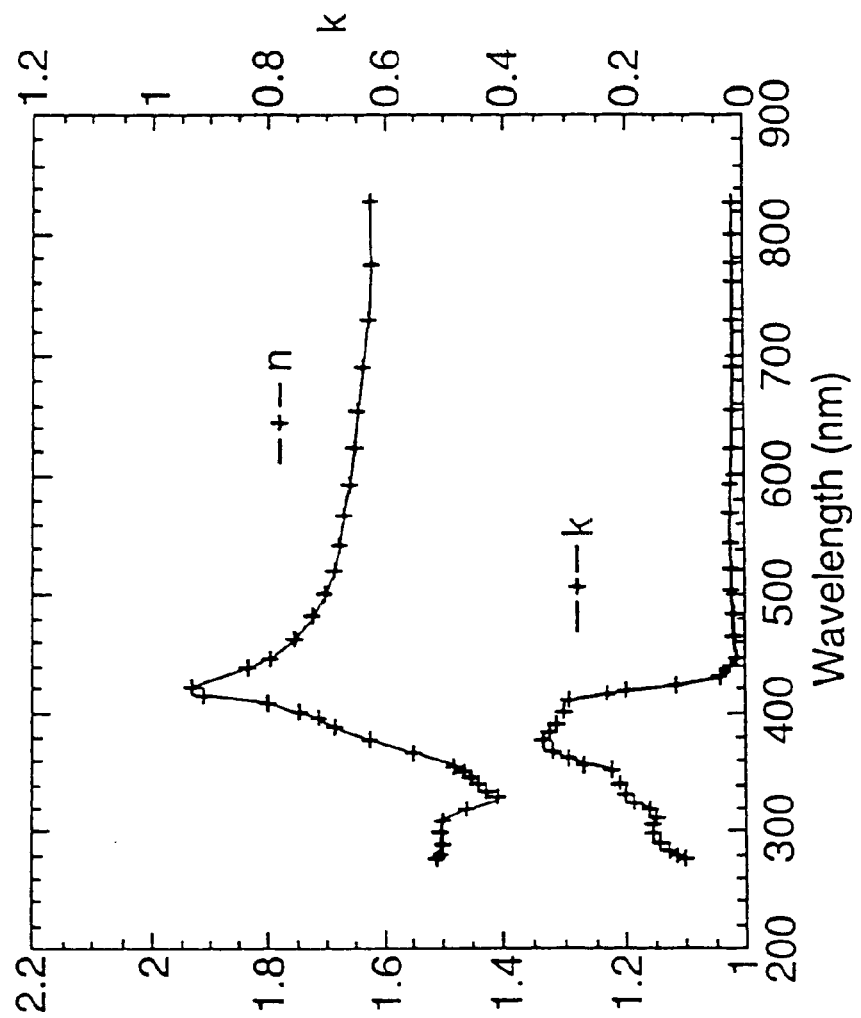

Fig. 13 (cont. B)
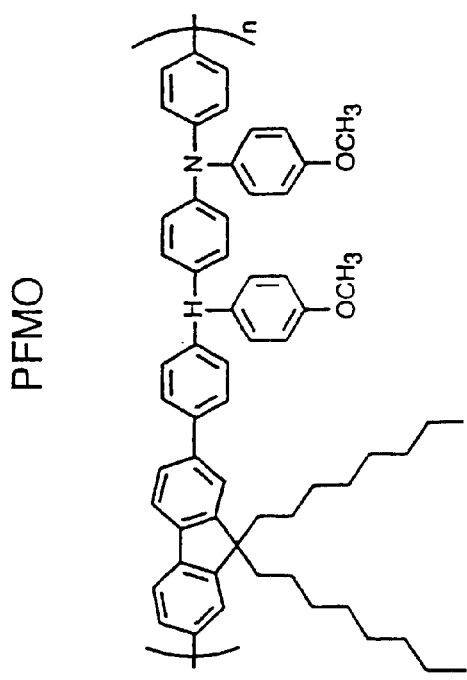
PFMO
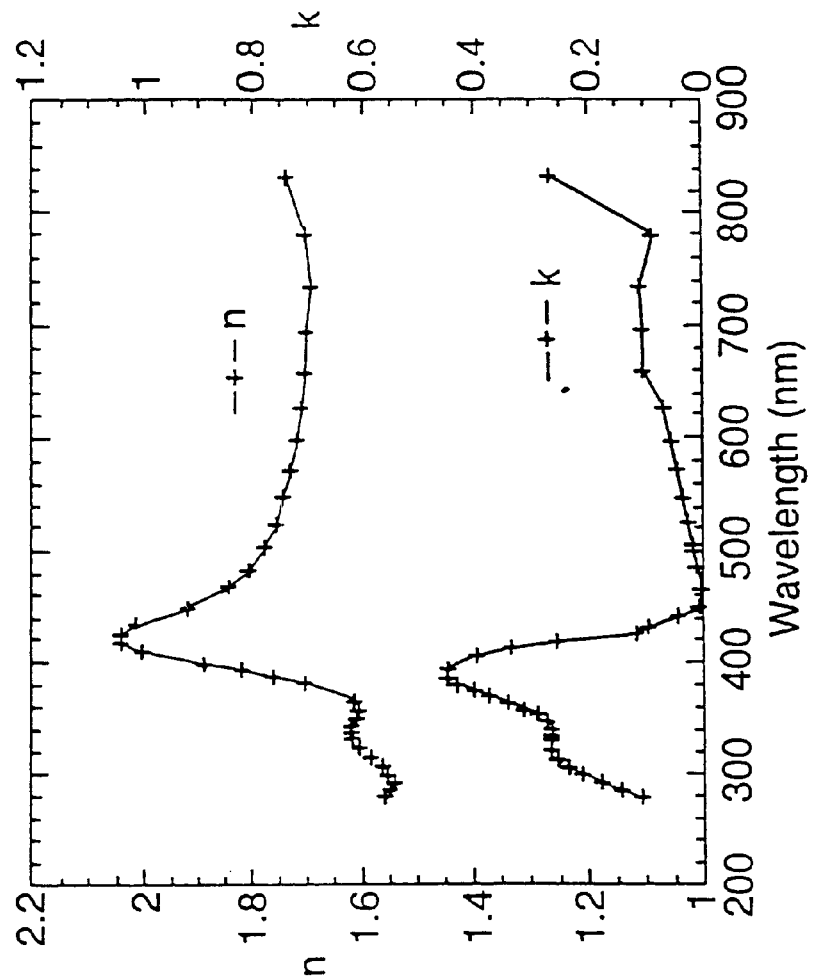

ORGANIC LIGHT EMITTING DEVICE INCORPORATING A WAVEGUIDE

BACKGROUND OF THE INVENTION

1. Field of the Invention

The present invention relates to an organic light emitting devices and other devices incorporating the same.

2. Description of Related Art

Light emitting devices are well known and have been used in many applications. In simple terms electric signals are used to stimulate light emissions and the emission of light from organic materials is associated with electronic transitions between energy levels.

An example of a basic device is shown in FIG. 1. The devices are normally structured as two electrodes (2,4) sandwiching a photoemitting layer (6) and provided on a transparent substrate (8). The electrodes are used to cause the movement of electrons and holes into the photoemitting layer and the recombination of the electron/hole pairs in the photoemitting layer results in light emissions.

Typically, the transparent substrate (8) is formed from glass, silica or a plastic. The upper, cathode electrode (2) is typically formed from Ca/Al or Li/Al or LiF/Al. The lower electrode (4) must be transparent and is typically formed from ITO (Indium Tin Oxide), $ZnO_2$, Indium Zinc Oxide or GaN.

The photoemitting layer (6) may preferably be formed from an organic material. The organic material may be of a low molecular type as described in the Article by Q W Tang in Applied Physics Letters 1987 pages 913 to 915. Alternatively, the organic layer may be of a polymer type as described in the Article by J H Burroughes in Nature 347 on pages 539 onwards published in 1990. Examples of low molecular type materials are shown in FIG. 2. Examples of polymers include polyfluorene and some of the derivatives thereof and these are shown in FIG. 3.

Light emitting devices using an organic layer (OLED) can be used in colour displays since the colour of the emitted light can be predetermined by selecting the particular chemical structure of the organic layer.

One of the advantages of organic materials is that they are relatively easy to handle during manufacture. For example, low molecular types may be applied by sublimation, e.g. vaporisation, whereas polymers may be applied by spin coating. During the subsequent processing of the device, a number of further features will need to be patterned. Such patterning using photo lithography often degrades the light emitting efficiency of the device. The impact of patterning can be reduced when using organic materials since low molecular types enables metal masks to be used and polymer types enables ink jet deposition techniques to be used. The ease of manufacturing the organic material itself and the improved resulting performance of the device following subsequent patterning, also enables large size devices to be formed.

As discussed previously, LEDs function by stimulating the injection of electrons and holes into the photoemitting layer. FIG. 4 illustrates in more detail the injection of electrons and holes and the recombination of electron/hole pairs, resulting in the generation of light emissions. FIG. 4 illustrates in 1) charge being injected, 2) charge being transported, 3) charges being captured to form an exciton and 4) electron/hole pairs recombining. In order to maximise the light emissions, the energy levels between the materials of the electrodes (2, 4) and the photoemitting layer (6) need to be carefully selected. The energy levels need to be selected such that there is an appropriate energy level gradient from the transparent electrode (4) to the cathode (2).

To improve the efficiency of OLEDs conjugated polymers may be used instead of a single layer of organic material. Conjugated polymers provide an interface within the photoemitting layer such that electron/hole pair recombinations tend to become concentrated at the interface. This leads to a concentration of light emissions from the immediate vicinity of the interface and reduces the possibility of direct transmission of electrons or holes across the photoemitting layer. The polymers shown in FIG. 3 are particularly suited to use in a conjugated polymer organic layer in an LED.

Waveguides enable light to be transmitted more efficiently from a source to a desired point of application.

Waveguides also form an essential part of the structure of semiconductor lasers, an example of which is shown schematically in FIG. 5. The arrangement comprises an inorganic photoemitting layer (12) disposed in a confinement layer (11). On each side of the confinement layer is a cladding layer (10), each of which is supported by a substrate (2). Light propogates in the photoemitting layer (12) and the confinement layer (11) and is reflected by the mirrors (14) (one of which is semi-transparent) such that a narrow, highly concentrated beam of coherent light is output by the laser.

In the semiconductor laser, the electrodes are not of course made of transparent materials.

Faced with a desire to concentrate the light output from an OLED, it would seem natural to consider the use of a waveguide. In addition, the structure of semiconductor lasers would lead to consideration of an OLED in which both electrodes are optically opaque and in which a waveguide is arranged to be "in-plane" with the light emitting layer. However, a number of difficulties arise. Importantly, organic materials tend to have a low conductivity. Therefore, in practical devices, the layer needs to be relatively thin, often in the order of 200 nm for many of the polymers. If the photoemitting layer is this thin, the output of a corresponding in-plane waveguide would exhibit a diffraction effect which would lead to poor coupling efficiency of the device with other optical devices. If the thickness of the layer is increased, then due to the poor conductivity of the organic material, the driving voltage tends to become prohibitively high.

SUMMARY OF THE INVENTION

Against this background, the present invention provides an organic light emitting device comprising: a first electrode and a transparent electrode with an organic light emitting layer therebetween; characterised by comprising a waveguide provided on the opposite side of the transparent electrode compared with the organic light emitting layer.

BRIEF DESCRIPTION OF THE DRAWINGS

Embodiments of the present invention will now be described by way of further example only and with reference to the accompanying drawings, in which.

DETAILED DESCRIPTION OF PREFERRED EMBODIMENTS

Figure 1:
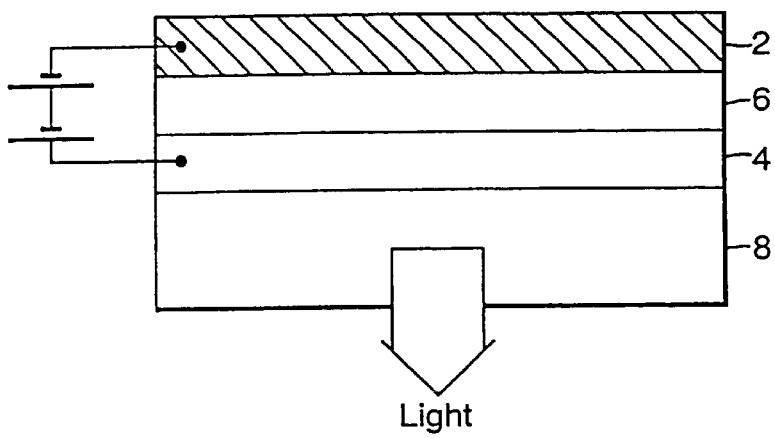
FIG. 1 is a schematic diagram of a prior art OLED.
Figure 3:
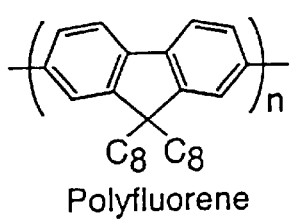
FIG. 3 gives examples of polymers typically used for forming conjugated polymers.
Figure 3:
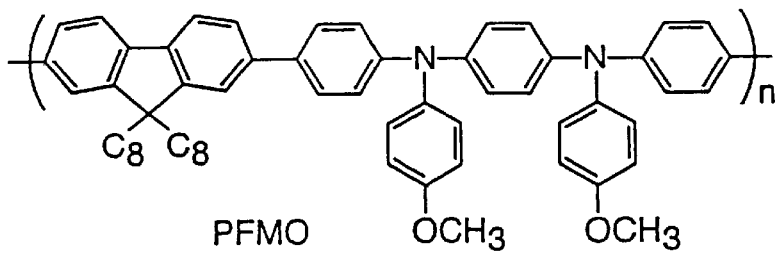
Figure 3:
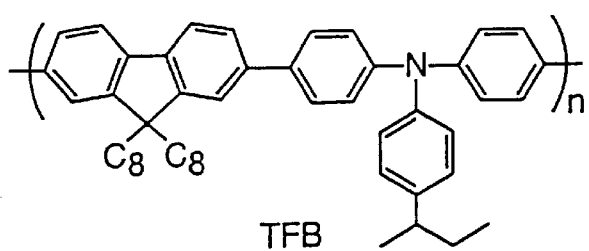
Figure 3:
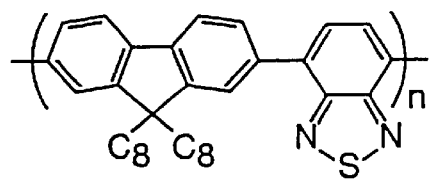
Figure 2:
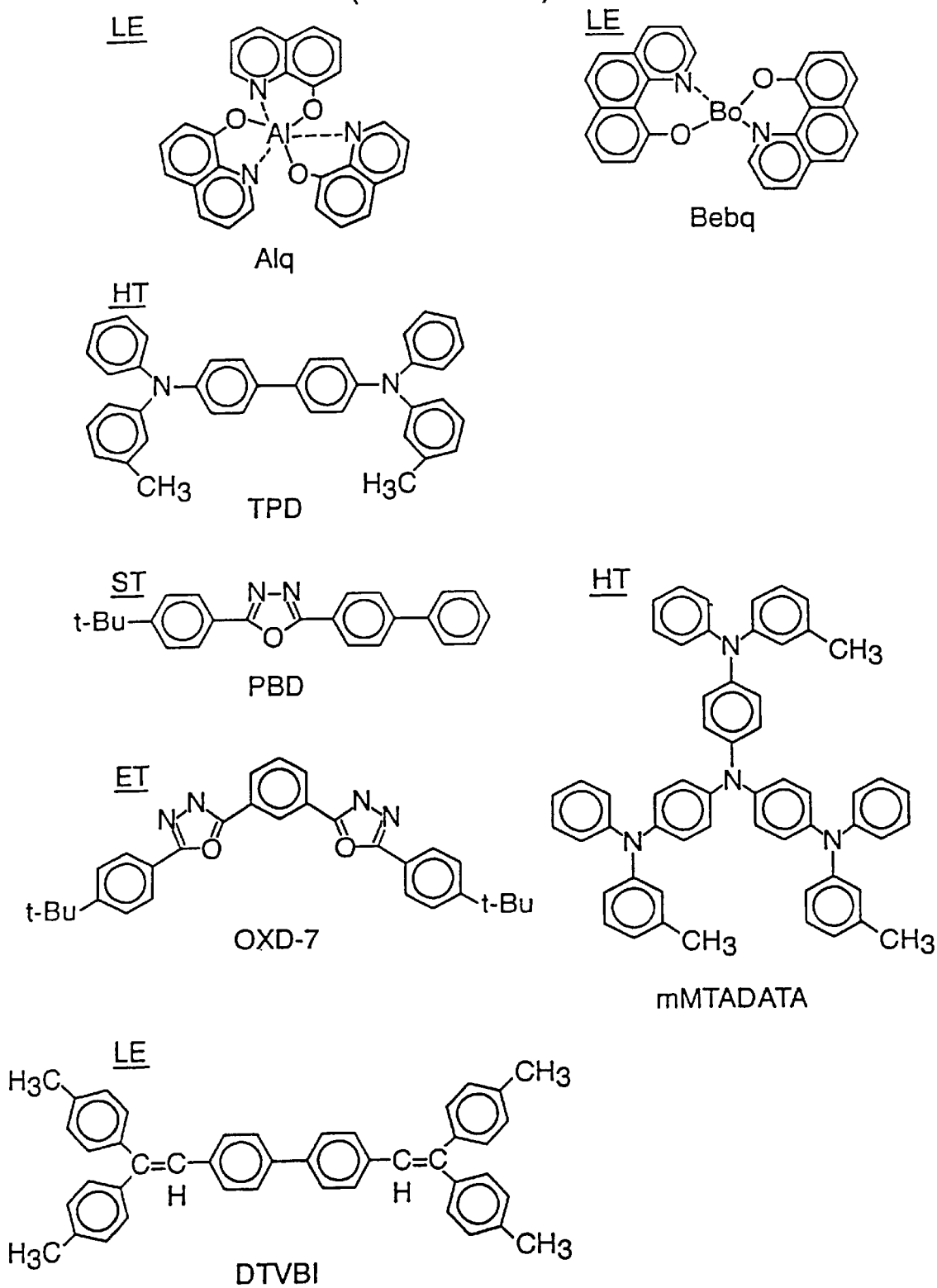
FIG. 2 gives examples of low molecular type materials.
Figure 4A:
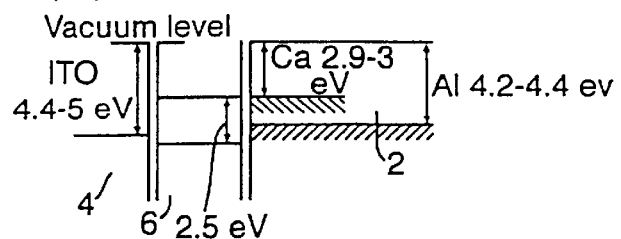
FIGS. 4a) and b) are schematic diagrams of the energy level considerations in an OLED.
Figure 4B:
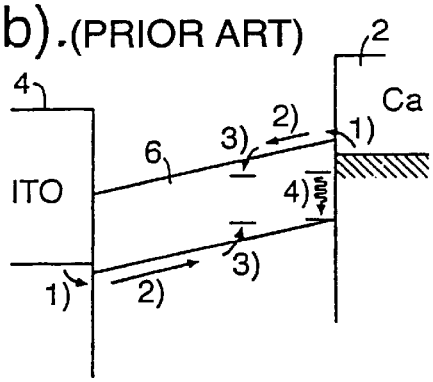
Figure 5:
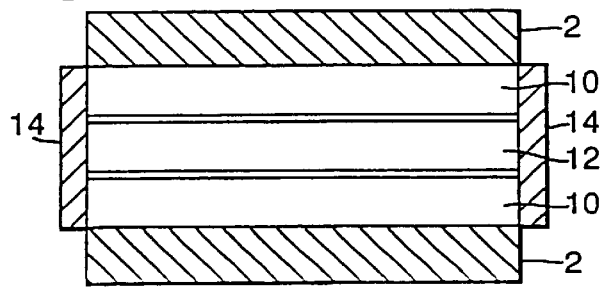
FIG. 5 is a schematic diagram of the the structure of a semiconductor laser.
Figure 6:
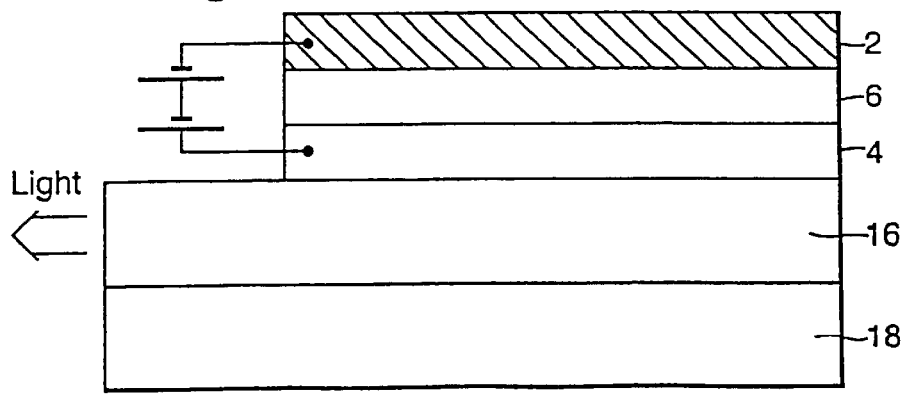
FIG. 6 is a schematic diagram of a preferred embodiment of the present invention.

The present invention provides an OLED with an external waveguide, for example as shown schematically in FIG. 6. The device includes a waveguide (16) arranged between the transparent electrode (4) and a substrate (18).

Preferably, the substrate (18) is of a transparent material. Generally, the light emitted from an OLED is viewed in a direction perpendicular to the photoemitting layer. In the embodiment of the present invention illustrated in FIG. 6, the materials of the cathode (2), the transparent electrode (4) and the waveguide (16) are selected carefully in conjunction with the material of the photoemitting layer (6) so as to enable light to be emitted from the photoemitting layer at an angle and to enhance entry into the waveguide (16). The materials are selected in accordance with their refractive indices and FIG. 7 demonstrates the basic principles involved.

Figure 7:
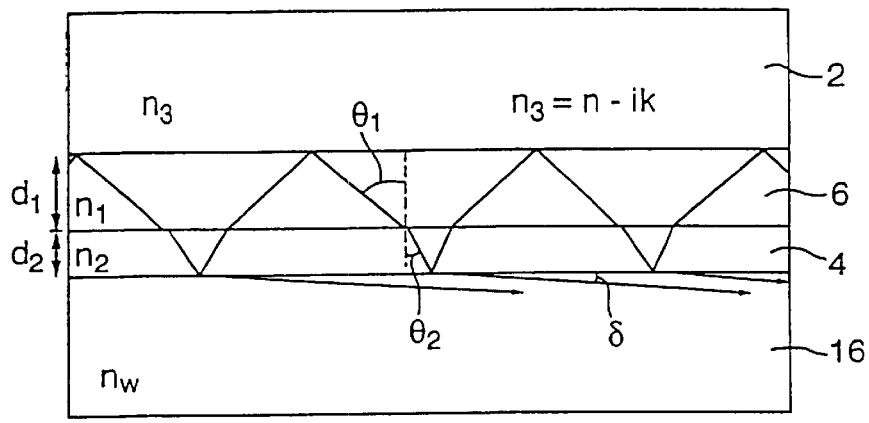
FIG. 7 is a schematic diagram and associated mathematical relationships of the photoemitting layer, transparent electrode and the waveguide.

FIGS. 6 and 7 show simple embodiments and such arrangements have the disadvantage of absorption by the cathode electrode. The insertion of a buffer layer between the cathode and the photoemitting layer mitigates this disadvantage. Light is completely reflected by the dielectric boundary when $\sin\theta_1$ is greater than $n_3/n_1$.

In the embodiments of FIGS. 6 and 7, when the substrate is of an opaque material, absorption by the substrate could also decrease the intensity of light. The buffer layer can enable the use of an opaque substrate without absorption of light thereby.

The equations given in FIG. 7 define the desirable relationship between wavelength, refractive indicies and thickness of the photoemitting layer and the transparent layer. The thickness of the photoemitting layer can be determined from other parameters.

Figure 8A:
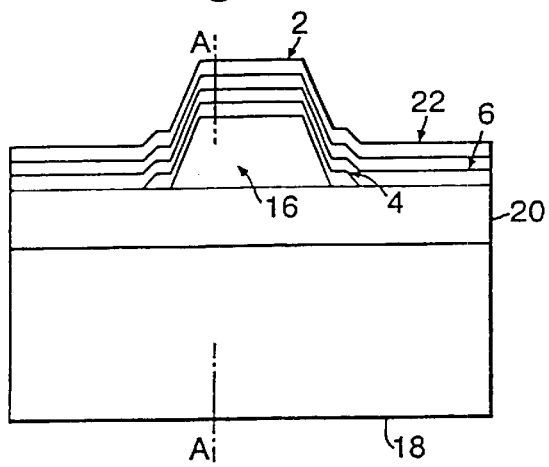
FIGS. 8a) and b) are schematic diagrams of a further embodiment of the present invention.
Figure 8B:
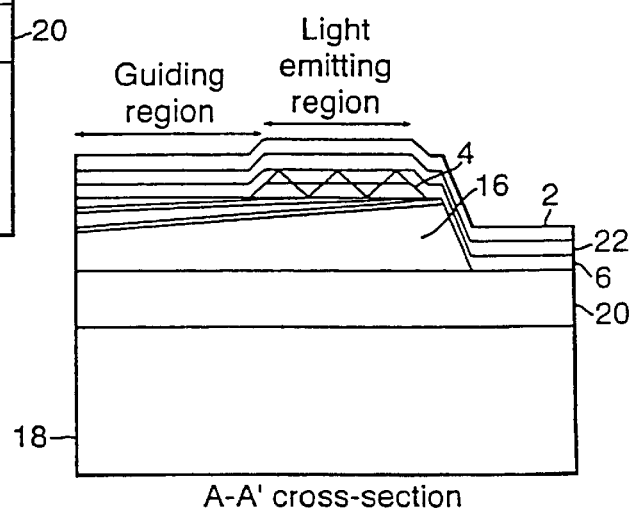
FIG. 8c) is similar to FIG. 7 but shows the inclusion of a cladding layer.

FIG. 8 illustrates a further embodiment of the present invention. In order to maximise the efficiency of the OLED, a buffer layer (20) may be provided between the waveguide (16) and the substrate (18). The buffer layer assists in reducing the loss of light to the substrate. Typically the buffer may be formed from $SiO_2$, polymer (photo polymerisation resin) or polyamide. If a buffer layer is used, then it is possible to effectively decouple the substrate so that the optical characteristics thereof do not significantly influence the functioning of the waveguide.

The OLED may be further enhanced by the provision of a cladding layer (22) between the cathode (2) and the photoemitting layer (6). The cladding layer reduces the loss of light to the cathode (2). The cladding layer may be formed from methyl-substituted poly (p-phenylene) or one of the polyfluorene derivatives.

Figure 8C:
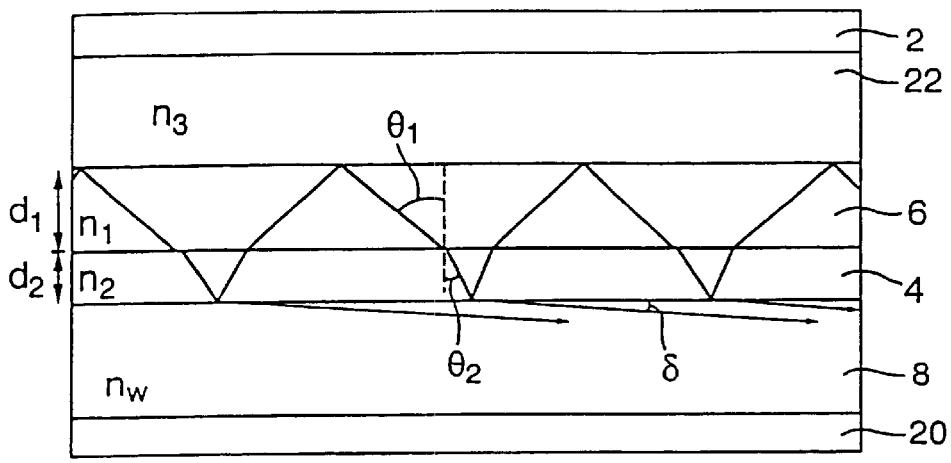

FIG. 8c is similar to FIG. 7 but shows the inclusion of a cladding layer (22). In this figure $n_3$ is the refractive index of the cladding layer rather than the refractive index of the cathode, as in FIG. 7. In FIG. 7 the cathode has a large absorption and thus $n_3$ in that arrangement is a complex number. In the arrangement shown in FIG. 8c, the cladding layer is transparent and $n_3$ is therefore a real number. Again, the equations given define the desirable relationship between wavelength, refractive indicies and thickness of the photoemitting layer and the transparent layer. But, the thickness of the photoemitting layer can be determined from other parameters.

If the refractive indices of the various components are designated as follows:

| | |
|---|---|
| Nsub | Substrate (18) |
| Nbuf | Buffer (20) |
| Nwav | Waveguide (16) |
| Ntrn | Transparent electrode (4) |
| Nemt | Photoemitting layer (6) |
| Ncld | Cladding layer (22) |

Then the desired relationships between the refractive indices are:

Nsub or Nbuf<Nwav

Nwav<Nemt and Ncld<Nwav

Ncld<Ntrn

Typically, the values for the refractive indices are in the following ranges:

| | | |
|---|---|---|
| Nsub | Opaque Substrate (18) | |
| Nsub | Transparent Substrate (8) | 1.45–1.6 |
| Nbuf | Buffer (20) | 1.4–1.5 |
| Nwav | Waveguide (16) | 1.6–2.2 |
| Ntrn | Transparent electrode (4) | 1.6–2.0 |
| Nemt | Photoemitting layer (6) | 1.7–2.7 |
| Ncld | Cladding layer (22) | 1.5–1.8 |

Figure 9:
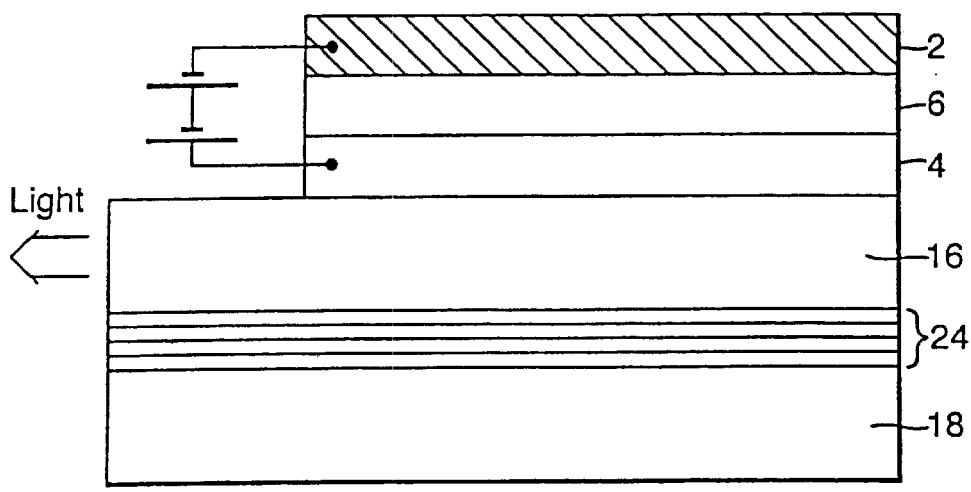
FIG. 9 is a schematic diagram of another embodiment of the present invention.

Instead of being restricted to the particular selection of materials dependent upon the relative refractive indices, a Distributed Bragg Reflector (DBR) may be used between the waveguide (16) and the substrate (18); with or without the presence of a buffer (20),. FIG. 9 illustrates the use of a DBR (24) arranged between the waveguide (16) and the substrate (18). The DBR comprises an arrangement of alternating layers of material of low refractive index with high refractive index. If the low refractive index layers have a thickness $d_L$ and a refractive index of $n_L$, and the high refractive index layers have a thickness $d_H$ and a refractive index of $n_H$, the layers will be selected as follows:

$(d_L n_L + d_H n) \cos \theta = \lambda/2$ where $\lambda$ is the wavelength of light.

In these circumstances the DBR (24) provides for very high reflectivity and wavelength selectivity.

The present invention as discussed above in relation to the various embodiments may be used in a wide variety of applications due to the advantages associated with the present invention. For example, since the photoemitting layer can be retained as a relatively thin layer, a low driving voltage can be used which leads to a low power consumption, there is less thermal effect and less deteriation of the materials used therein. The thick waveguide provides a high intensity output with a small divergence angle in the output beam. This facilitates efficient coupling to other optical devices such as lenses, fibre optics and the like.

Figure 10:
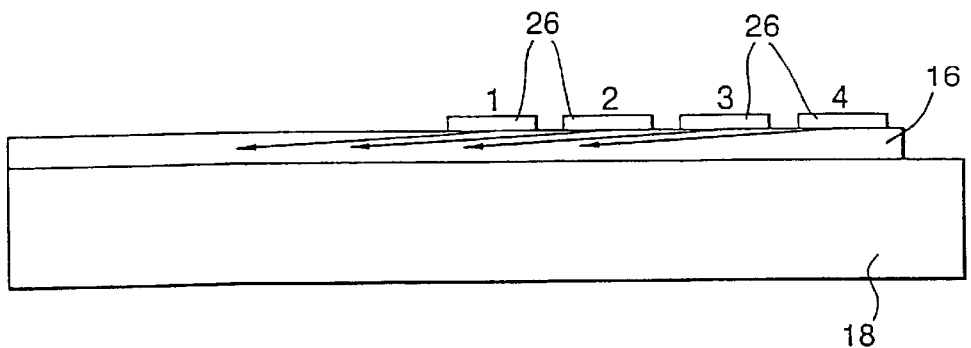
FIG. 10 is a schematic diagram of the present invention used to provide colour displays or high speed modulation pulsed outputs.

Any one of the aforegoing embodiments of the present invention may be used in various applications. For example, FIG. 10 illustrates a number of OLEDs (26) arranged on a single waveguide. In the device shown, there are four OLEDs 26(1), 26(2), 26(3) and 26(4) each emitting light into the same waveguide.

Each OLED may be used to generate light of a different wavelength. If the OLEDs (26) are arranged to generate light, at least one of which generates red, blue or yellow, then the device will be capable of providing full multi-colour displays.

Figure 11:
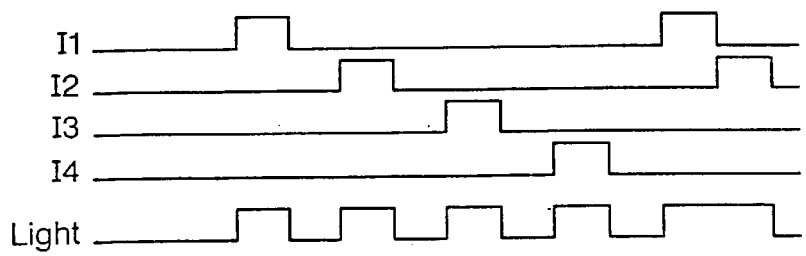
FIG. 11 is a timing diagram illustrating the formation of a high speed pulsed output.

Alternatively, as shown in FIG. 11 each OLED may be driven to emit a pulse of light so as enable the device to provide high speed modulation pulsed outputs. If the first OLED 26(1) emits pulse I1 and the next OLED 26(2) emits pulse I2 etc, then the emerging beam will have the modulation shown at the bottom of the Figure. This has the advantage of reducing the duty cycle of the individual OLEDs, which results in less heat generation and other improvements associated therewith.

Figure 12:
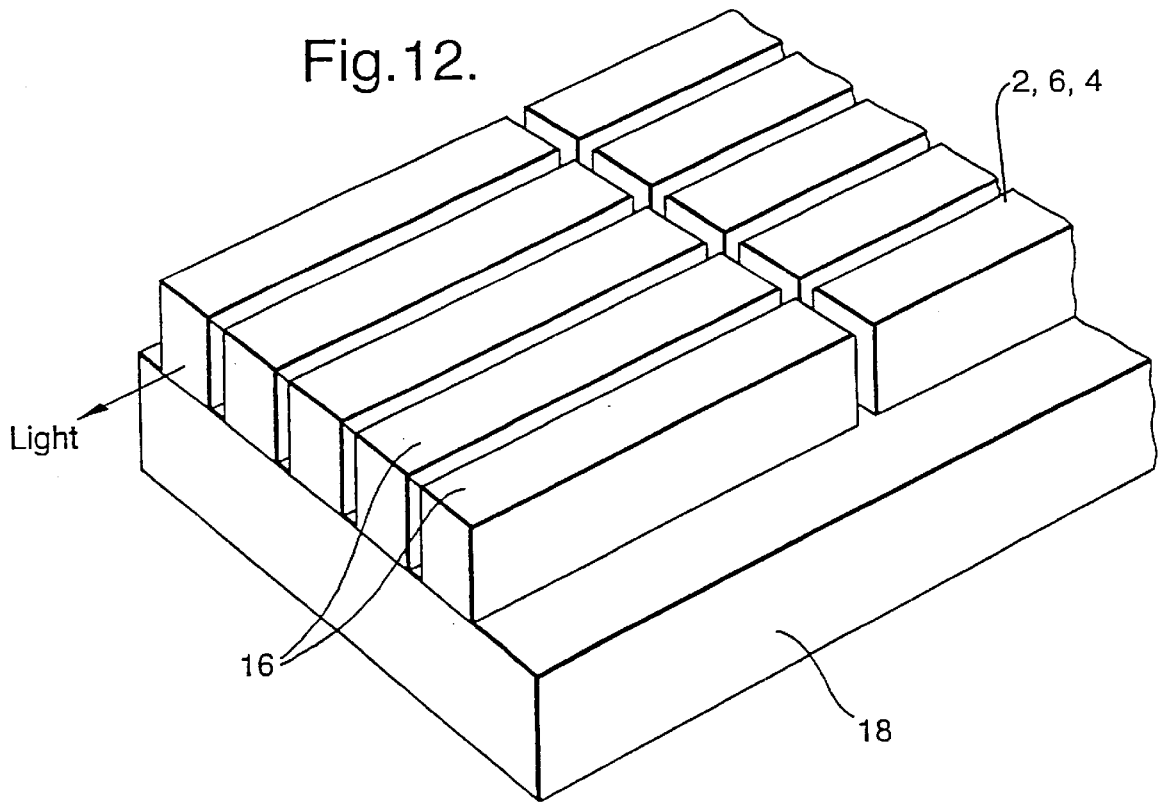
FIG. 12 is a schematic diagram of a number of OLEDs according to the present invention arranged on a single substrate.

A number of OLEDs may also be arranged each with their own respective waveguide and fabricated on the same substrate, as shown in FIG. 12. The use of OLEDs in the type of arrangement shown in FIG. 12 can achieve significantly larger sizes than a similar arrangement of semiconductor lasers (which are limited to a single substrate wafer size typically of 10–15 cm). The illustrated arrangement has particular application to the use in printers, photocopiers, portable facsimile machines and the like. In such machines, a photo-conductive drum, photo reactive material or film is illuminated by the linear array of OLEDs. A driving system stimulates each of the OLEDs to generate the desired output for illuminating with the photo-conductive layer. Uniformity of the individual light sources is significantly improved since the whole array is fabricated as a single unit.

Figure 13:
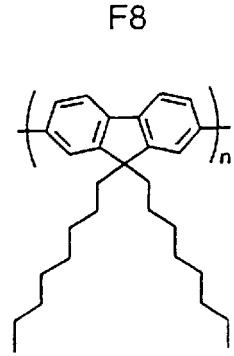
FIG. 13 illustrates the relationship between wavelength, refractive index and absorption constant for examples of conjugate polymers, namely polyfluorene and three derivatives thereof.
Figure 13:
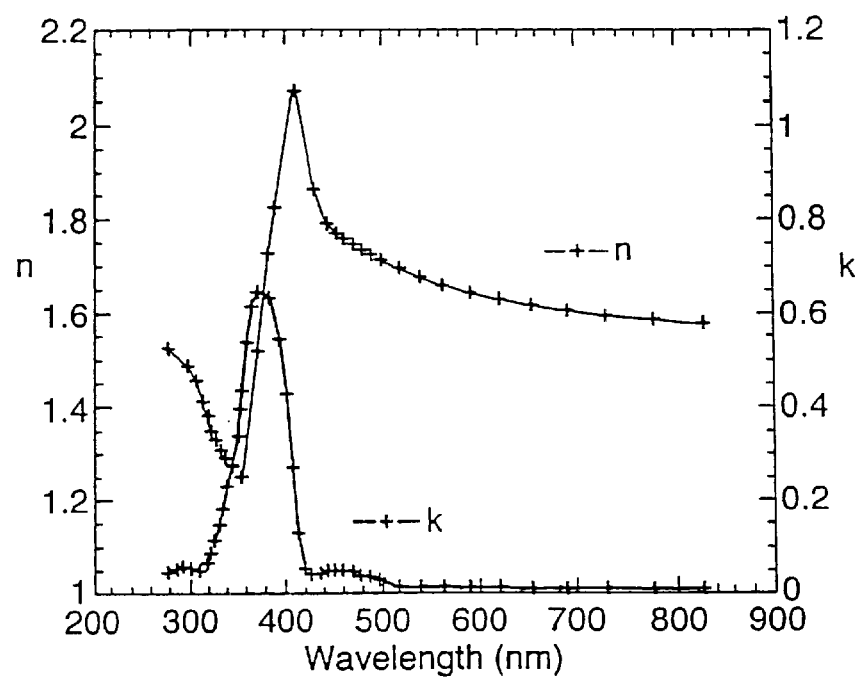

Reference is now made to FIG. 13 which shows the relationships between wavelength, refractive index and absorption constant for an example of a polymer, namely polyfluorene and a derivative; which materials can be used in a conjugated polymer arrangement. On review of these graphs, it can be seen that for certain ranges of wavelength, eg 520 nm to 780 nm, the absorption constant is relatively low yet the refractive index remains high. Thus, at a wavelength within this range the production and transmission of light in arrangements according to the present invention can be optimised using these materials.

Arrangements according to the present invention may beneficially employ a polymer such as polyfluorene or one of its derivatives as the material of the waveguide. Thus, the light efficiency from such an OLED can be further optimised.

The aforegoing description has been given by way of example only and it will be appreciated by persons skilled in the art that modifications can be made without departing from the scope of the present invention.

What is claimed is:

1. An organic light emitting device, comprising:
   a first electrode;
   a transparent electrode;
   an organic light emitting layer disposed between the first electrode and the transparent electrode; and
   a waveguide provided on the opposite side of the transparent electrode compared to the organic light emitting layer and having an interface with the transparent electrode, wherein at least one of a refractive index and a thickness of the light emitting layer and a refractive index and a thickness of the transparent electrode are arranged to cause, in operation of the device, resonance of light emitted by the light emitting layer within the light emitting layer and the transparent electrode and to cause light emitted from the light emitting layer to enter the waveguide at a shallow grazing angle relative to the interface between the waveguide and the transparent electrode.

2. An organic light emitting device as claimed in claim 1, further comprising a substrate on the opposite side of the waveguide compared to the transparent electrode.

3. An organic light emitting device as claimed in claim 2, wherein said substrate is optically opaque.

4. An organic light emitting device as claimed in claim 2, further comprising a buffer layer disposed between the waveguide and the substrate.

5. An organic light emitting device as claimed in claim 1, further comprising a cladding layer disposed between the first electrode and the organic light emitting layer.

6. An organic light emitting device as claimed in claim 1, in which the refractive index of the waveguide is less than the refractive index of the light emitting layer.

7. An organic light emitting device as claimed in claim 1, further comprising a Distributed Bragg Reflector disposed on the opposite side of the waveguide compared to the transparent electrode.

8. An organic light emitting device as claimed in claim 1, in which the waveguide is formed of a conjugated polymer.

9. A device comprising at least two organic light emitting devices as claimed in claim 1, wherein respective waveguides of the at least two organic light emitting devices are provided in the form of a single waveguide common to the at least two organic light emitting devices.

10. A device as claimed in claim 9, comprising a driving circuit for driving the organic light emitting layer of each light emitting device to generate light at different times from each other.

11. A device as claimed in claim 9, wherein the organic light emitting layer of each light emitting device is selected to emit light with a respectively different wavelength distribution.

12. A device as claimed in claim 9, comprising three light emitting devices each arranged to emit a respective one of red, blue and yellow light.

13. A device as claimed in claim 9, wherein the at least two organic light emitting devices are formed on a common substrate.

14. An organic light emitting device as claimed in claim 1, wherein at least one of the refractive index and the thickness of the light emitting layer, and the refractive index and the thickness of the transparent electrode are arranged according to the following equation:

$$\frac{4\pi(n_1 d_1 \cos\theta_1 + n_2 d_2 \cos\theta_2)}{\lambda} - 2\phi_S = 2m\pi$$

where m is a whole integer;

$n_1$ is the refractive index of the light emitting layer;

$d_1$ is the thickness of the light emitting layer;

$n_2$ is the refractive index of the transparent electrode;

$d_2$ is the thickness of the transparent electrode;

$\phi_S$ is the phase shift which occurs at an interface between the light emitting layer and the first electrode;

$\theta_1$ is the angle of incidence of the light emitted by the light emitting layer, and propagating in the light emitting layer, relative to an interface between the light emitting layer and the transparent electrode;

$\theta_2$ is the angle of incidence of the light emitted by the light emitting layer, and propagating in the transparent electrode, relative to the interface between the transparent electrode and the waveguide; and $\lambda$ is the wavelength of the light emitted by the light emitting layer in operation of the light emitting device and resonating within the light emitting layer and the transparent electrode.

15. An organic light emitting device as claimed in claim 1, wherein the shallow grazing angle is 10° or less.

* * * * *